United States Patent
Brueckl et al.

(10) Patent No.: US 7,075,814 B2
(45) Date of Patent: Jul. 11, 2006

(54) METHOD FOR HOMOGENEOUSLY MAGNETIZING AN EXCHANGE-COUPLED LAYER SYSTEM OF A DIGITAL MAGNETIC MEMORY LOCATION DEVICE

(75) Inventors: Hubert Brueckl, Bielefeld (DE); Ulrich Klostermann, Fontainebleau (FR); Joachim Wecker, Roettenbach (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 10/495,301

(22) PCT Filed: Oct. 8, 2002

(86) PCT No.: PCT/DE02/03789

§ 371 (c)(1),
(2), (4) Date: Dec. 15, 2004

(87) PCT Pub. No.: WO03/043036

PCT Pub. Date: May 22, 2003

(65) Prior Publication Data

US 2005/0105355 A1 May 19, 2005

(30) Foreign Application Priority Data

Nov. 12, 2001 (DE) ................................ 101 55 424

(51) Int. Cl.
*G11C 11/00* (2006.01)
(52) U.S. Cl. ........................ 365/158; 365/157; 365/171
(58) Field of Classification Search ................ 365/158, 365/157, 171
See application file for complete search history.

(56) References Cited

U.S. PATENT DOCUMENTS 6,744,086 B1 * 6/2004 Daughton et al. .......... 257/295
6,795,334 B1 * 9/2004 Iwata et al. ................. 365/158

OTHER PUBLICATIONS

Tong H C et al: "The Spin Flop of Synthetic Antiferromagnetic Films"Journal of Applied Physics, American Institute of Physics,. New York, U.S., vol. 87, No. 9, May 1, 2000, pp. 5055-5077, XP000947735 ISSN: 0021-8979 (the whole document).
Copy of International Search Report dated Jul. 3, 2003.

* cited by examiner

*Primary Examiner*—Tuan T. Nguyen
(74) *Attorney, Agent, or Firm*—Slater & Matsil, L.L.P.

(57) ABSTRACT

A method and apparatus for homogeneously magnetizing an exchange-coupled layer system of a digital magnetic memory cell device comprising an AAF layer system and an antiferromagnetic layer that exchange-couples a layer of the AAF layer system, characterized in that, given a defined direction of magnetization of the antiferromagnetic layer, the magnetic layers of the AAF layer system are saturated in a magnetic field and, afterward, the position of the direction of the antiferromagnetic layer magnetization and the direction of the saturating magnetic field relative to one another is changed, so that they are at an angle α of 0°<α<180° relative to one another, after which the saturating magnetic field is switched off.

13 Claims, 4 Drawing Sheets

METHOD FOR HOMOGENEOUSLY MAGNETIZING AN EXCHANGE-COUPLED LAYER SYSTEM OF A DIGITAL MAGNETIC MEMORY LOCATION DEVICE

BACKGROUND

1. Field of the Invention

The following relates to a method and apparatus for homogeneously magnetizing an exchange-coupled layer system of a digital magnetic memory cell device comprising an AAF layer system and an antiferromagnetic layer that exchange-couples a layer of the AAF layer system.

2. Background Information

A digital magnetic memory cell device stores information on a magnetic basis. An individual memory cell device is generally part of a memory device, often also called an MRAM (magnetic random access memory). Such a memory can carry out read and/or write operations. Each individual memory cell device comprises a soft-magnetic read and/or write layer system, separated by means of an intermediate layer from a hard-magnetic reference layer system, which is formed as an AAF system in the case of the present type of memory cell device. The magnetization of the reference layer of the reference layer system is stable and does not change in an applied field, while the magnetization of the soft-magnetic read and/or write layer system can be switched by means of an applied field. The two magnetic layer systems may be magnetized in a parallel or antiparallel fashion with respect to one another. The two aforementioned states in each case represent a bit of information, i.e. the logic zero ("0") or one ("1") state. If the relative orientation of the magnetization of the two layers changes from parallel to antiparallel, or vice versa, then the magnetoresistance changes by a few percent over this layer structure. This change in the resistance can be used for reading out digital information stored in the memory cell.

The change in the cell resistance can be identified by a voltage change. By way of example, in the case of a voltage increase, the cell may be occupied by a logic zero ("0") and, in the event of a voltage decrease, the cell may be occupied by a logic one ("1"). Particularly large changes in resistance in the region of a few percent have been observed when the magnetization orientation changes from parallel to antiparallel, and vice versa, in cell structures of the GMR type (giant magnetoresistance) or TMR type (tunnel magnetoresistance).

An important advantage of such magnetic memory cells is that the information is stored persistently in this way, and is stored without maintaining any basic supply even with the device switched off, and is immediately available again after the device is switched on, in contrast to known conventional semiconductor memories.

A central component part in this case is the reference layer system, formed as an AAF system (AAF=artificial antiferromagnetic). Such an AAF system is advantageous on account of its high magnetic rigidity and the relatively low coupling to the read and/or write layer system by virtue of the so-called orange peel effect and/or by virtue of macroscopic magnetostatic coupling fields. An AAF system generally comprises a first magnetic layer or a magnetic layer system, an antiferromagnetic coupling layer and a second magnetic layer or a magnetic layer system which is coupled with its magnetization via the antiferromagnetic coupling layer oppositely to the magnetization of the lower magnetic layer. Such an AAF system may be formed e.g. from two magnetic Co layers and an antiferromagnetic coupling layer made of Cu.

In order to improve the rigidity of the AAF system, that is to say its resistance toward external fields, it is customary to arrange an antiferromagnetic layer at that magnetic layer of the AAF system which is remote from the read and/or write layer system. This antiferromagnetic layer additionally pins the directly adjacent magnetic layer in its magnetization, with the result that the AAF system overall becomes harder (exchange pinning or exchange biasing).

The magnetic rigidity of the AAF system corresponds to the amplitude of the applied external field which is required for rotating the magnetizations of the two ferromagnetic layers in the same direction, that is to say for parallel setting. This limits the magnetic window for read and write applications of such a memory cell device.

In this case it is always an aim for the magnetic layers of the AAF layer system, which, by way of example, besides the material combination mentioned in the introduction, may also comprise two ferromagnetic CoFe layers and an Ru layer introduced in between, to be magnetized as homogeneously as possible, ideally with a single homogeneous magnetization direction. The magnetization in the case of the memory element in question having the AAF layer system and the additional exchange-coupling or pinning antiferromagnetic coupling layer, e.g. made of IrMn, is effected in such a way that, after the production of the layer stack, the layer stack is heated to a temperature greater than the blocking temperature of the antiferromagnetic layer, that is to say e.g. of the IrMn, a strong magnetic field that saturates the two magnetic layers of the AAF layer system being present during this. This leads to an orientation of the magnetic layer magnetizations, and, on account of the couplings, also of the magnetization of the antiferromagnetic layer. The temperature is subsequently decreased again. If the external setting magnetic field is then likewise withdrawn, the magnetization of the magnetic layer which is not coupled to the antiferromagnetic layer begins to rotate on account of the AAF system coupling.

In this case, however, a multiplicity of so-called 360° walls form in the magnetization of the layer. These 360° walls, which are manifested as winding, sinuous lines in the context of carrying out a domain observation, entail a series of disadvantages. Thus, by way of example, the signal that can be tapped off via the memory element, for example a TMR signal in the case of a TMR memory element (TMR=tunnel magnetoresistive), is reduced. The magnetization reversal behavior of the measurement layer, e.g. made of permalloy, which is separated from the AAF layer system by means of a decoupling layer, e.g. made of Al2O3, is also less favorable on account of the leakage fields, those via the 360° walls, in which the magnetization rotates once through 360°.

SUMMARY

Embodiments of the invention is thus based on a problem of specifying a method that enables a homogeneous magnetization, whilst avoiding the disadvantageous 360° walls to the greatest possible extent.

In the case of a method of the type mentioned in the introduction, it is provided that, given a defined direction of magnetization of the antiferromagnetic layer, the magnetic layers of the AAF layer system are saturated in a magnetic field and, afterward, the position of the direction of the magnetization of the antiferromagnetic layer and the direction of the saturating magnetic field relative to one another is changed, so that they are at an angle a of 0°<a<180° relative to one another, after which the saturating magnetic field is switched off.

A method is disclosed for homogeneously magnetizing an exchange-coupled layer system of a digital magnetic memory cell device comprising an AAF layer system and an antiferromagnetic layer that exchange-couples a layer of the AAF layer system. The magnetic layers of the AAF layer system are saturated in a magnetic field, given a defined direction of magnetization of the antiferromagnetic layer. The position of the direction of the antiferromagnetic layer magnetization and the direction of the saturating magnetic field is changed relative to one another, such that they are at an angle α of 0°<α<180° relative to one another. After which, the saturating magnetic field is switched off.

A magnetoresistive memory cell device is also disclosed, having a homogeneously magnetized exchange-coupled layer system comprising an AAF layer system and an antiferromagnetic layer that exchange-couples a layer of the AAF layer system. The device is formed by saturating the magnetic layers of the AAF layer system in a magnetic field as described above.

A magnetoresistive memory device also is disclosed, comprising a plurality of memory cell devices as described above.

Additionally, an apparatus is disclosed for performing a method for homogeneously magnetizing an exchange-coupled layer system of a digital magnetic memory cell device comprising an AAF layer system and an antiferromagnetic layer that exchange-couples a layer of the AAF layer system. The apparatus comprises a receptacle for a substrate having at least one memory cell device, and a magnetic field generating device, characterized in that the receptacle and the magnetic field generating device can be rotated with respect to one another.

Further advantages, features and details of the invention emerge from the exemplary embodiments described below and also on the basis of the drawings.

DETAILED DESCRIPTION

In the figures below, identical reference symbols designate the same elements and structures, and descriptions in respect thereof are not repeated for every occurrence in all the figures. A list of reference symbols utilized consistently in the figures is provided below:

LIST OF REFERENCE SYMBOLS

Figure 1:
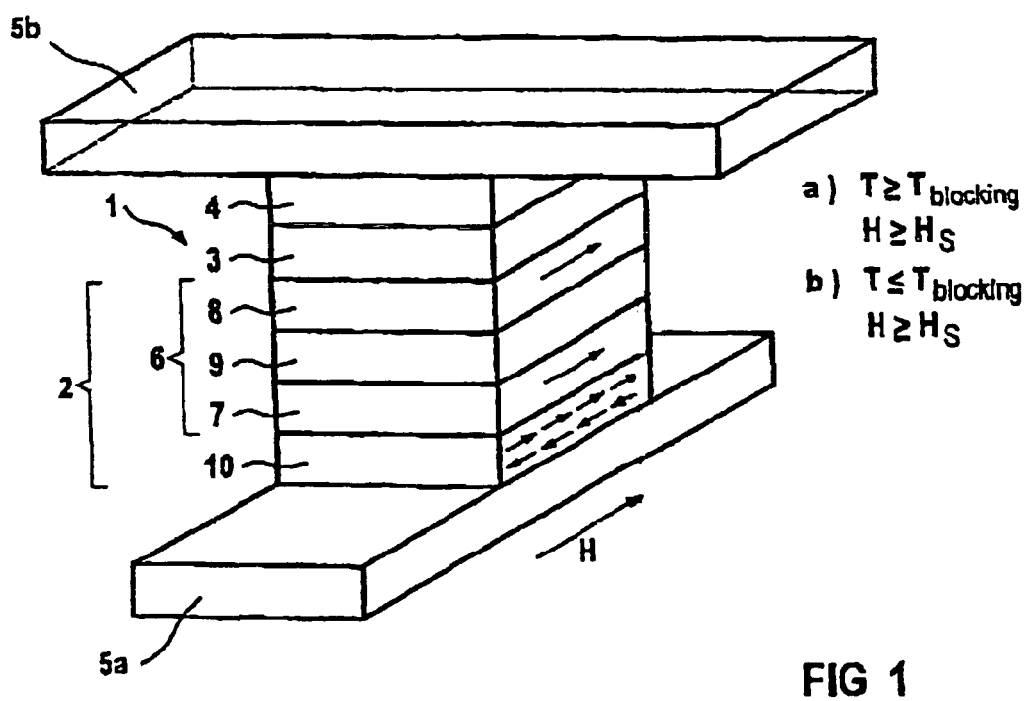
FIG. 1 is a schematic diagram of a memory cell device according to an embodiment of the invention during magnetization, with a temperature lying above the blocking temperature in the presence of a saturating magnetic field.

1 Memory cell device
2 Reference layer system
3 Decoupling layer
4 Soft-magnetic measurement layer system
5a, 5b Word and bit lines
6 AAF layer system
7 Lower ferromagnetic layer
8 Upper ferromagnetic layer
9 Coupling layer
10 Antiferromagnetic layer
11 Apparatus
12 Receptacle
13 Rotary table
14 Substrate
15 Magnetic field generating device
16 Apparatus
17 Receptacle
18 Substrate
19 Magnetic field generating device
20 Rotary device
T Temperature
H Magnetic field
P Arrow
N Pole
S Pole FIG. 1 shows a memory cell device 1 according to an embodiment of the invention. This memory cell device comprises a so-called reference layer system 2, which is decoupled from a soft-magnetic measurement layer system 4 by means of a decoupling layer 3, e.g. Al2O3. The illustration furthermore shows the word and bit lines 5a, 5b, which run above and below at right angles to one another. The reference layer system 2 comprises an AAF layer system 6, comprising a lower ferromagnetic layer 7, an upper ferromagnetic layer 8 and an antiparallel-coupling coupling layer 9 arranged between the latter. The ferromagnetic layers may be made e.g. of Co or CoFe, and the antiparallel-coupling coupling layer may be made of Cu or of Ru. The construction of such an AAF layer system is sufficiently known.

The reference layer system 2 furthermore comprises an antiferromagnetic layer 10, e.g. made of Ni, FeMn, IrMn, NiMn, PtMn, CrPtMn, RhMn or PdMn, provided below the lower ferromagnetic layer 7. The antiferromagnetic layer 10 couples the magnetization of the lower ferromagnetic layer 7 situated above it, i.e. the latter is oriented parallel to the magnetic moments of the antiferromagnetic layer in the interface region. As a result of this, the magnetization of the ferromagnetic layer 7 is pinned by exchange biasing. This function and this construction are also sufficiently known.

For the purpose of setting the magnetization of the magnetic layers 7 and 8 and also the magnetization of the antiferromagnetic layer 10, the memory cell device, which is shown as a detail here only in the form of a schematic diagram and is normally formed with a multiplicity of further memory elements on a large-area wafer, is heated to a temperature T above the blocking temperature Tblocking of the antiferromagnetic layer 10. At a temperature above the blocking temperature, the antiferromagnetic layer loses its antiferromagnetic properties. The magnetic moments of the layer can be oriented by an external magnetic field. Such an external magnetic field H is applied, the latter being greater than the saturation magnetic field HS required to saturate the magnetizations of the magnetic layers 7, 8. The magnetizations of the layers 7, 8, represented by the long arrows, are clearly oriented parallel to the external field, and the magnetic moments of the antiferromagnetic layer 10 are also oriented correspondingly, the moments near the interface, which lie in the interface region with respect to the magnetic layer 7, coupling parallel thereto.

The temperature is subsequently decreased, so that it is below the blocking temperature Tblocking. When the temperature falls below the blocking temperature, the antiferromagnetic layer 10 undergoes transition to the antiferromagnetic state again; the magnetization is "frozen". However, the external magnetic field is still present in saturating fashion.

Figure 2:
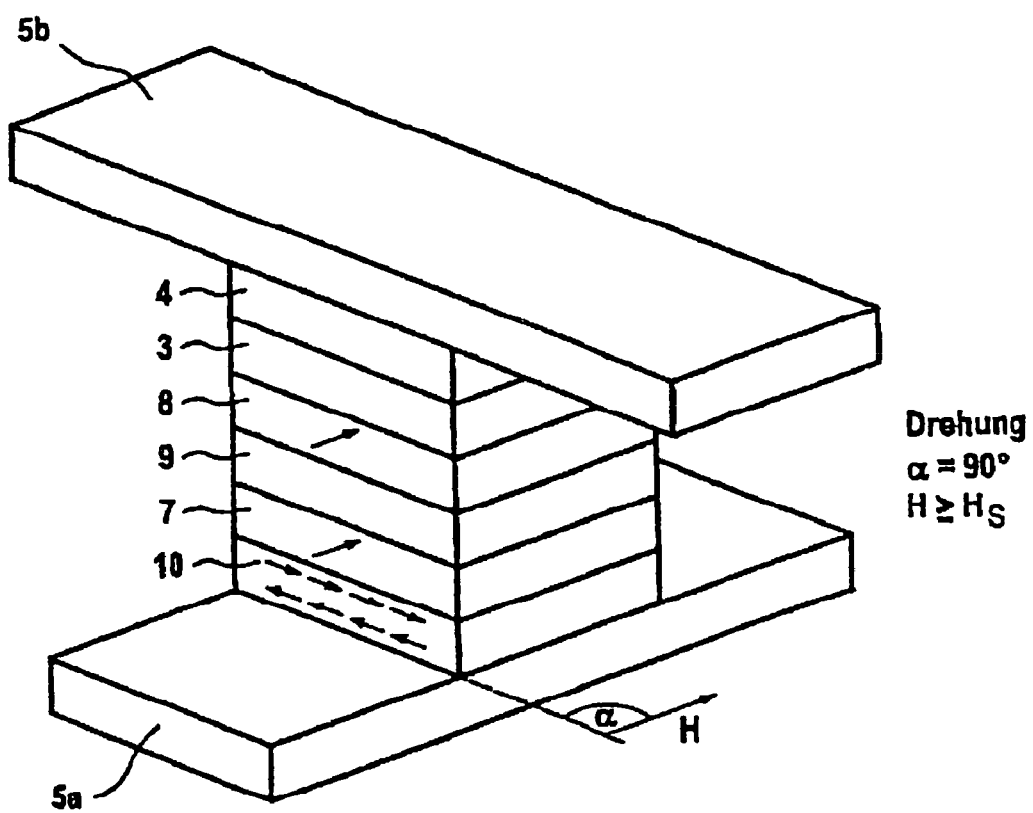
FIG. 2 illustrates the memory cell device from FIG. 1, after a rotation with a stationary saturating magnetic field and with the temperature previously having been decreased.

As shown in FIG. 2, a rotation through an angle a is subsequently effected, when a is 90° in this case. The magnetization of the antiferromagnetic layer 10 clearly remains in the formerly set direction, i.e. it does not change despite the external saturating magnetic field H that is still present. The angle a is the angle which the magnetization direction of the layer 10 assumes with respect to the external magnetic field H, as is depicted in FIG. 2.

In contrast to the stationary magnetization of the antiferromagnetic layer 10, in the event of a rotation of the memory cell device with respect to the stationary external magnetic field, the magnetizations of the magnetic layers 7 and 8 rotate during the rotation, i.e. they still remain parallel to the external magnetic field H, as is clearly shown in FIG. 2. They are thus at an angle with respect to the direction of magnetization of the antiferromagnetic layer 10, the angle likewise being a=90°.

Figure 3:
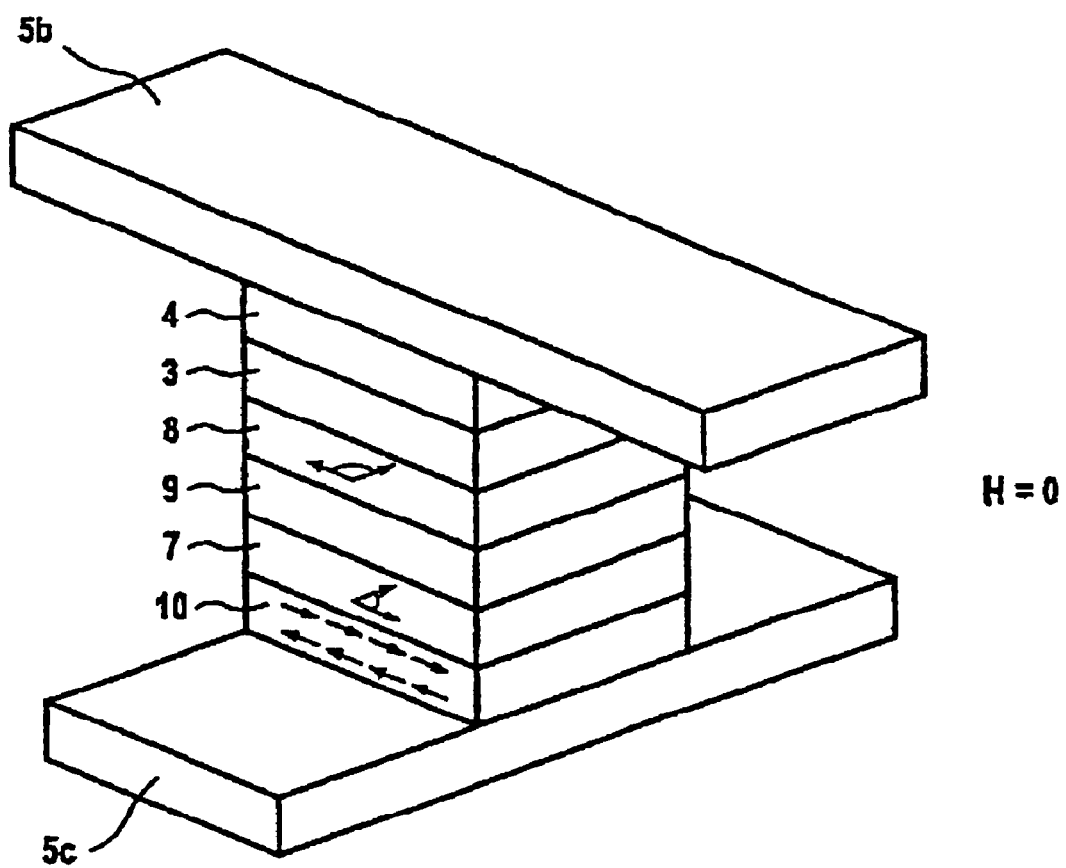
FIG. 3 illustrates the memory cell device from FIG. 2 after the magnetic field has been switched off.

Afterward, see FIG. 3, the external magnetic field is switched off. This has the effect that differently directed rotation processes take place in the two magnetic layers 7 and 8. While the magnetization of the lower magnetic layer 7, which lies adjacent to the antiferromagnetic layer 10, in the example shown, is established toward the right and thus parallel to the moments of the antiferromagnetic layer 10 which are near the interface, which is governed by the strong exchange coupling between the two layers, the magnetization of the magnetic layer 8 rotates in the opposite direction on account of the coupling properties of the coupling layer 9. FIG. 3 shows, by means of broken lines, in each case the initial positions of the magnetizations, as are known from FIG. 2, and the solid arrows represent the respective end position after rotation has taken place. Clearly, both magnetizations rotate only through a relatively small angle, namely through 90°, governed by the previously adopted setting of the memory cell device with respect to the external magnetic field, as described with reference to FIG. 2. There exists for the respective magnetization of the layers 7, 8 an excellent shortest rotation path in order to rotate into the setting respectively defined in a coupling-dictated manner. A decomposition of the magnetization into different magnetization regions or the formation of undesirable 360° walls is precluded on account of this preferred direction of rotation.

Figure 4:
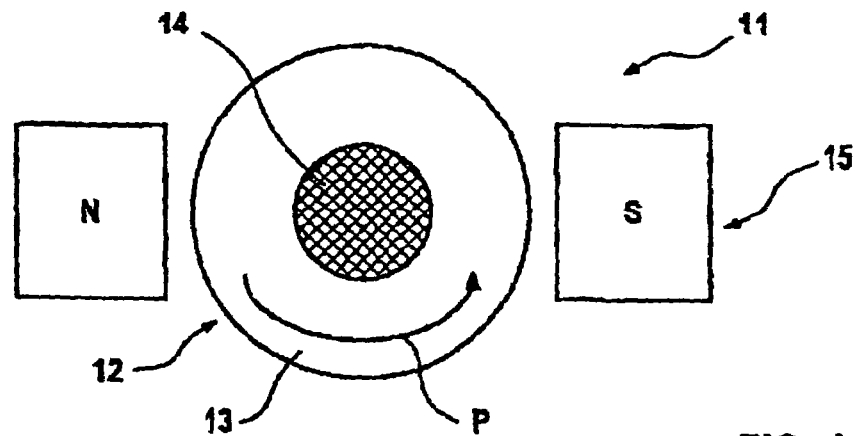
FIG. 4 is a schematic diagram of a first embodiment of an apparatus according to the invention.

FIG. 4 shows an apparatus 11 of a first embodiment, which serves for carrying out the method described with reference to FIGS. 1–3. It comprises a receptacle 12 in the form of a rotary table 13, which can be rotated as shown by the arrow P. A substrate 14, at which are formed a multiplicity of memory cell devices (which form a memory device) with the layer system described in the introduction, is arranged on said rotary table. The rotary table 13 itself can expediently be heated. It is assigned a magnetic field generating device 15, as is indicated by the two magnetic poles N and S. In order to carry out the method, the substrate 14 is positioned on the rotary table 13, followed by the high degree of heating and the application of the external saturating magnetic field, after which the cooling and subsequent rotation and finally the switching off of the external magnetic field are performed, as described in detail with reference to FIGS. 1–3.

Figure 5:
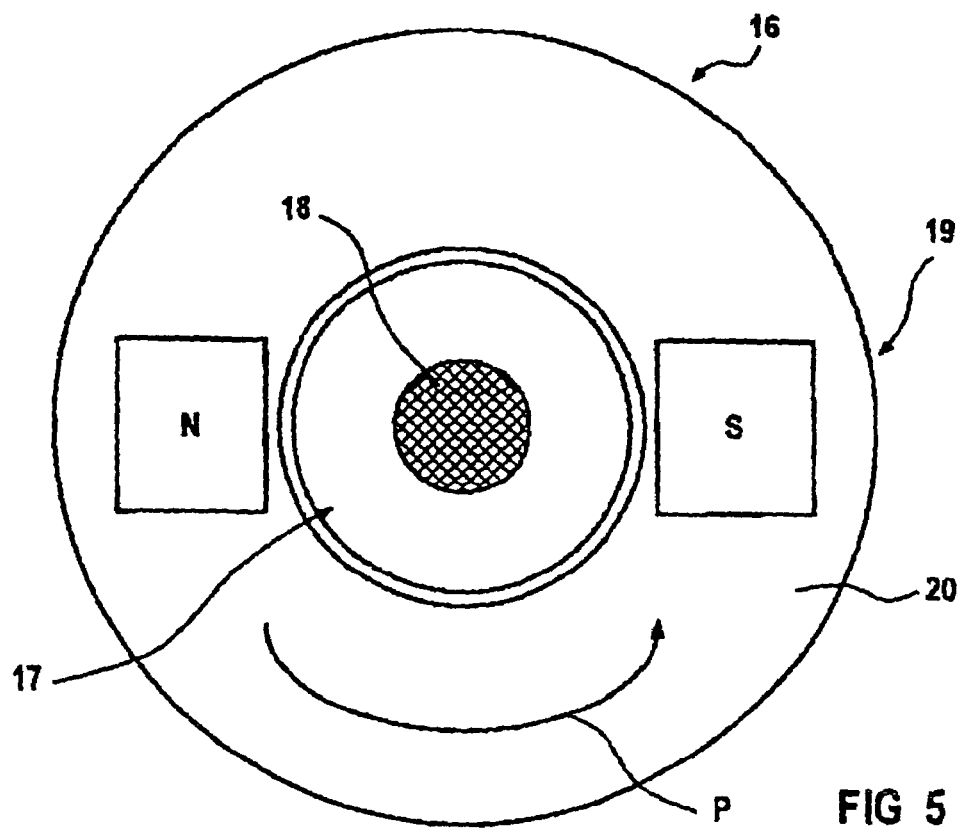
FIG. 5 is a schematic diagram of a second embodiment of an apparatus according to the invention.

FIG. 5 shows a further apparatus 16 according to an embodiment of the invention. In the case of this apparatus, the receptacle 17 is formed as a heatable table which, however, cannot be rotated. A substrate 18 is also to be arranged on the receptacle 17. By contrast, the magnetic field generating device 19, which is again indicated by the two poles N and S in this case as well, is mounted in a rotatable manner on a suitable rotary device 20, e.g. in the form of a rotary table, as is likewise shown by the arrow P. A somewhat modified method for producing a homogeneous magnetization is possible in the case of this apparatus. Instead of the memory cell device being rotated with respect to the stationary magnetic field in the manner described with reference to FIG. 2, here the memory cell device remains stationary, while the magnetic field is rotated for the purpose of setting the angle 'a.'

Embodiments of the invention bring the magnetization of the antiferromagnetic pin layer, which, on account of the very strong exchange coupling with respect to the adjoining magnetic layer of the AAF layer system, retains the magnetization thereof, and the direction of the magnetic field at an angle<180° and >0°, and subsequently switching off the magnetic field. Since the magnetization direction of the antiferromagnetic layer has already been established, the magnetization of the adjoining magnetic layer of the AAF system will then automatically rotate in the same direction. On account of the coupling of the second magnetic layer of the AAF system via the coupling layer arranged in between, the magnetization of the second magnetic layer then rotates in the opposite direction. On account of the setting of the direction of the antiferromagnetic layer magnetization and of the saturating magnetic field still present beforehand with respect to one another, however, rather than a rotation through 180°, it is now necessary only for a rotation through a significantly smaller angle to take place. This is because, on account of the angular setting and the saturating magnetic field still present beforehand, the still saturated magnetization of the two magnetic AAF layers is not at an angle of 0 or 180° with respect to the magnetization of the antiferromagnetic layer, but rather at an intermediate angle. It is only through this intermediate angle that the magnetization of the second magnetic AAF layer now has to be rotated. The magnetization will thus preferably rotate exclusively in this one direction which has the shorter rotation path and consequently permits a more favorable rotation in terms of energy. This therefore precludes decomposition of the magnetization or the formation of the 360° walls, which primarily form when the magnetization has to rotate through 180°, since in this case a rotation is possible in two directions, namely from 180° to 0° and from 180° to 360° (ultimately to the "left" and "right"), which leads to the wall formation. The setting of the magnetization directions thus defines a preferred direction of rotation in which the layer magnetization rotates, which advantageously leads to the 360° walls being avoided.

An angle 'a' of 60° to 120°, in particular of 90°, can expediently be set. In the case of an angle of 90°, the magnetization of the adjacent AAF layer that is pinned by means of the antiferromagnetic layer has to rotate through 90° and the magnetization of the second magnetic layer also has to rotate likewise through 90°, but in the other direction. The path is relatively short overall for both magnetizations, with the result that a homogeneous magnetization is established.

For the purpose of setting the angle, a number of possibilities are conceivable in the context of the magnetization. On the one hand, the memory element may be rotated with respect to the stationary magnetic field; as an alternative to this, it is possible to move the magnetic field with respect to the stationary memory element. Finally, it is also possible for both to be moved with respect to one another.

Methods according to embodiments of the invention make it possible to avoid the formation of 360° walls even during the first magnetization of a memory element. For the purpose of setting the magnetization of the antiferromagnetic layer, the temperature is increased above the blocking temperature of the layer, the saturating magnetic field being present during the increase in temperature, after which the temperature is decreased and the magnetization of the layer system is set. Thus, in this case, the saturation of the magnetic layers of the AAF system and the setting of the magnetization of the antiferromagnetic layer are performed simultaneously, which, since the temperature lies above the blocking temperature, is adapted to the magnetization direction of the adjacent magnetic layer of the AAF system. The temperature is subsequently decreased, with the result that the magnetization of the antiferromagnetic layer is as it were frozen after the temperature has fallen below the blocking temperature. The memory element and/or the magnetic field is subsequently rotated for the purpose of setting the angle a with the magnetic field still present, after which this is switched off and the magnetizations of the two magnetic layers of the AAF system rotate in the two different directions.

However, methods according to the invention equally also make it possible to subsequently homogenize a memory element which has already been magnetized and has 360° walls, that is to say is magnetized inhomogeneously. For this purpose, the magnetization of the AAF layer system is saturated in a sufficiently high magnetic field without the temperature being increased beforehand. After saturation, the system is rotated with respect to the magnetic field, e.g. through 90° with respect to the original saturation direction of the antiferromagnetic layer, in which case the latter has expediently been oriented parallel to the external saturation magnetic field beforehand or the memory element has been positioned correspondingly. After rotation, the external magnetic field is driven back, in such a way as to rotate back through the corresponding angular sections the layer magnetizations which lay in the direction of the external magnetic field despite the rotation on account of the saturation.

In addition to such methods, a magnetoresistive memory cell device is disclosed that has been magnetized in accordance with the method. Furthermore, a magnetoresistive memory device is disclosed that comprises a plurality of memory cell devices.

Furthermore, the invention relates to an apparatus for carrying out the method, comprising a receptacle for a substrate having at least one memory element, and also a magnetic field generating device. The apparatus is distinguished by the fact that the receptacle and the magnetic field generating device can be rotated with respect to one another. According to a first refinement of the invention, the receptacle may be a rotary table and the magnetic field generating device may be stationary, i.e. the substrate, at which, by its nature, a multiplicity of memory elements are formed, is in this case rotated with respect to the stationary magnetic field. As an alternative, the receptacle may be stationary and the magnetic field generating device may be rotatable.

It is particularly advantageous if the receptacle, and if appropriate the rotary table, can be heated in order to heat the substrate as rapidly as possible to a temperature above the blocking temperature, if this is required.

Overall, the invention proposes a method which is simple to practice, requires no additional time-consuming or costly method steps and enables the homogeneous magnetization of the relevant layers of a memory cell device or memory system.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. A method for homogeneously magnetizing an exchange-coupled layer system of a digital magnetic memory cell device comprising an AAF layer system and an antiferromagnetic layer that exchange-couples a layer of the AAF layer system, comprising:
   saturating the magnetic layers of the AAF layer system in a magnetic field, given a defined direction of magnetization of the antiferromagnetic layer;
   changing the position of the direction of the antiferromagnetic layer magnetization and the direction of the saturating magnetic field relative to one another, such that they are at an angle $\alpha$ of $0°<\alpha<180°$ relative to one another; and
   switching off the saturating magnetic field.

2. The method as in claim 1, further comprising the step of setting an angle $\alpha$ of between 60° and 120°, in particular of 90°.

3. The method as in claim 1, further comprising the step of rotating the memory cell device with respect to the stationary magnetic field for the purpose of setting the angle.

4. The method as in claim 1, further comprising the step of moving the magnetic field with respect to the stationary memory cell device for the purpose of setting the angle.

5. The method as in claim 1, further comprising the step of moving the magnetic field and the memory cell device for the purpose of setting the angle.

6. The method as claim 1, further comprising the steps of:
   increasing the temperature above the blocking temperature of the layer for the purpose of setting the magnetization of the antiferromagnetic layer, the saturating magnetic field being present during the increase in temperature, and
   after which the temperature is decreased and the magnetization of the layer system is set.

7. A magnetoresistive memory cell device, having a homogeneously magnetized exchange-coupled layer system comprising an AAF layer system and an antiferromagnetic layer that exchange-couples a layer of the AAF layer system, formed by saturating the magnetic layers of the AAF layer system in a magnetic field, given a defined direction of magnetization of the antiferromagnetic layer, changing the position of the direction of the antiferromagnetic layer magnetization and the direction of the saturating magnetic field relative to one another, such that they are at an angle $\alpha$ of $0°<\alpha<180°$ relative to one another, and switching off the saturating magnetic field.

8. A magnetoresistive memory device comprising a plurality of memory cell devices, wherein the memory cell devices have a homogeneously magnetized exchange-coupled layer system comprising an AAF layer system and an antiferromagnetic layer that exchange-couples a layer of the AAF layer system, formed by saturating the magnetic layers of the AAF layer system in a magnetic field, given a defined direction of magnetization of the antiferromagnetic layer, changing the position of the direction of the antiferromagnetic layer magnetization and the direction of the saturating magnetic field relative to one another, such that they are at an angle α of 0°<α<180° relative to one another, and switching off the saturating magnetic field.

9. An apparatus for performing a method for homogeneously magnetizing an exchange-coupled layer system of a digital magnetic memory cell device comprising an AAF layer system and an antiferromagnetic layer that exchange-couples a layer of the AAF layer system, comprising:
  a receptacle for a substrate having at least one memory cell device, and
  a magnetic field generating device, characterized in that the receptacle and the magnetic field generating device can be rotated with respect to one another.

10. The apparatus in claim 9, wherein the receptacle is a rotary table and the magnetic field generating device is stationary.

11. The apparatus in claim 9, wherein the receptacle is stationary and the magnetic field device is rotatable.

12. The apparatus in claim 9, wherein the receptacle, and if appropriate the rotary table, can be heated.

13. A method for homogeneously magnetizing an exchange-coupled layer system of a digital magnetic memory cell device comprising an AAF layer system and an antiferromagnetic layer that exchange-couples a layer of the AAF layer system, comprising:
  saturating magnetic layeres of the AAF layer system in a magnetic field, given a defined direction of magnetization of the antiferromagnetic layer;
  changing by rotation the position of the direction of the antiferromagnetic layer magnetization and direction of the saturating magnetic field relative to one another, so that they are at an angle a of 0°<a<180° relative to one another, and
  after which, switching off the saturating magnetic field.

* * * * *